United States Patent [19]
Fanning

[11] 3,806,766
[45] Apr. 23, 1974

[54] PACKAGED ELECTRICAL COMPONENT ASSEMBLY AND METHOD OF FABRICATION

[75] Inventor: William J. Fanning, Glen Ellyn, Ill.

[73] Assignee: Western Electric Company Incorporated, New York, N.Y.

[22] Filed: Dec. 27, 1972

[21] Appl. No.: 318,790

[52] U.S. Cl. ............. 317/101 CC, 29/627, 264/272
[51] Int. Cl. ............................................. H05k 1/04
[58] Field of Search .. 174/52 PE; 317/261, 101 CC; 264/272; 29/637; 339/17 C

[56] References Cited

UNITED STATES PATENTS

| | | | |
|---|---|---|---|
| 3,484,536 | 12/1969 | Jaeschke et al. | 174/52 PE |
| 3,061,762 | 10/1962 | Schlegel | 174/52 PE |
| 3,165,568 | 1/1965 | Sternbeck | 264/272 |
| 2,935,669 | 5/1960 | Abeel et al. | 317/261 |
| 2,894,316 | 7/1959 | Genovese | 174/52 PE |

*Primary Examiner*—David Smith, Jr.
*Attorney, Agent, or Firm*—D. D. Bosben

[57] ABSTRACT

A packaged assembly of electrical components, such as capacitors, includes a compartmented shell of molded plastic having an inner wall, an open mouth and opposed side walls. In forming the component assembly, the leads of each component are bent in a common plane so that they extend outwardly at an acute angle to the body of the component, with bends in the leads spaced from the body. Each component then is moved into a compartment in the shell with the leads riding in opposed grooves in the side walls so that outer portions of the leads are flexed into substantially parallel relationship with respect to the grooves and project from the grooves in predetermined positions defined thereby. As each component is initially moved into the shell the leads of the component pass between retaining protuberances adjacent the grooves, the protuberances thereafter retaining the leads in the grooves as the component is moved further into the shell. Movement of each component into the shell is interrupted by a rib on the inner wall, or by the bends in the leads engaging inner ends of the grooves. The components then are encapsulated in a substantially fluid-impervious dielectric potting material.

8 Claims, 10 Drawing Figures

PACKAGED ELECTRICAL COMPONENT ASSEMBLY AND METHOD OF FABRICATION

BACKGROUND OF THE INVENTION

1. Field of the Invention

This invention relates to a packaged electrical component assembly and a method of fabricating the assembly, and more particularly to a packaged capacitor assembly having relatively high moisture resistance and capacitance stability, which can be readily fabricated with leads of the capacitors in exact predetermined positions so as to facilitate subsequent insertion of the leads into preformed apertures in a printed circuit board.

2. Description of the Prior Art

In the manufacture of electronic circuits it is standard practice to mount individual electrical components, such as capacitors, resistors and diodes, on one side of a printed circuit board by inserting leads of the components through preformed apertures in the board, after which projecting portions of the leads are crimped and soldered to land areas on the opposite side of the board. Each component is manufactured to a predetermined value within limits and is insulated and suitably protected against moisture and physical damage, generally prior to its being mounted on the board. For example, in the case of certain capacitors, each capacitor may be wrapped in plastic tape and impregnated with a suitable filler material. A capacitor also may be potted in an insulation lined container utilizing an insulating and moisture-proofing potting material, or encapsulated in other manners, such as by dipping, spraying, molding or sleeving.

The manufacture of capacitors as above-described, while necessary in certain instances, is disadvantageous because of the difficulty in forming each capacitor to an exact value within the desired limits and the expense involved in insulating each capacitor individually. Accordingly, in many applications it is more desirable to manufacture capacitors utilizing the same general process, sort the capacitors by value, and then select capacitors of varying values in multiples of two or more so that their combined effective capacitance is equal to a desired capacitance value. It also is desirable to encapsulate a plurality of capacitors simultaneously and in such a manner that the resultant capacitor package subsequently can be readily mounted on a printed circuit board, regardless of whether the component leads are of the axially or radially extending type.

For example, the package preferably should be of the plug-in type with all of the leads projecting from the same side of the finished assembly so that they subsequently can be inserted directly into their respective preformed apertures in the board, whereby the circuitry on the board can be utilized to interconnect the capacitors electrically as necessary without any additional wiring being required. Since the positions of the leads cannot be changed significantly after the capacitors have been encapsulated, it also is essential that the leads be located in exact positions corresponding to the positions of the apertures prior to encapsulating the capacitors, and be retained in these positions during encapsulation. This is true even where a single capacitor is involved, particularly where it is being potted, to eliminate the need for undue bending of the leads into the proper positions after the potting operation, and to facilitate mounting of the potted capacitor in close proximity to the circuit board. Each capacitor also should be substantially encapsulated in its entirety to provide electrical isolation and moisture-proofing protection for the capacitor so that it will be relatively stable under operating conditions.

Prior known arrangements for encapsulating a plurality of components in a single package, however, are not intended for use in the manner set forth hereinabove, and do not posses all of the desirable characteristics noted. For example, in the U.S. Pat. No. 3,098,950, issued July 23, 1963 to R. A. Geshner, a plurality of electrical components with axially extending leads are positioned in closely adjacent relationship in opposed recesses formed in a pair of mating blocks of insulating material with the leads of the components projecting from opposite sides of the blocks through locating slots therein. Printed circuit boards then are positioned against the opposite sides of the insulating blocks so that the component leads and a plurality of embedded terminals in the blocks extend through apertures in the boards, and the leads and terminals are interconnected by being soldered to circuitry on the boards, after which the entire assembly, including the printed circuit boards, is cast in plastic or other insulating material to form an internally wired unit. In addition to being packaged for use in a manner other than described hereinabove, this device requires the use of a separate printed circuit board and a separate soldering operation on each side of the assembly in the fabrication thereof.

Similarly, the U.S. Pat. No. 3,364,567, issued Jan. 23, 1968 to D. R. Brown et al. discloses the forming of a capacitor network having a single capacitance value, in which a plurality of closely adjacent capacitors are interconnected at their opposite ends by suitable leads and a pair of projecting connector terminals. The entire network is then suspended in an insulation lined metal container and encapsulated, with only the connector terminals of the network projecting from the encapsulating material, to form an internally wired capacitance unit.

SUMMARY OF THE INVENTION

In accordance with this invention, a packaged electrical component assembly includes a shell of a substantially fluid-impervious dielectric material having an inner wall and an open mouth in opposed relationship, and a pair of opposed side walls having oppositely disposed grooves which define predetermined positions for the leads of the component and which have open ends adjacent the open mouth of the shell. In forming the packaged assembly, the leads of the component are bent in a common plane so that they extend outwardly at an acute angle to the body of the component and so that bends in the leads are spaced apart a distance on the order of the spacing of the grooves. The component then is moved into the shell toward the inner wall with the leads riding in the grooves whereby outer portions of the leads are flexed into substantially parallel relationship with respect to the grooves and project from the shell in the predetermined positions defined by the grooves. With the component spaced from the inner wall of the shell, the component then is encapsulated in a substantially fluid-impervious dielectric potting material.

More specifically, as the component is moved into the shell the leads are forced through spaces defined by retaining protuberances adjacent their respective grooves, after which the protuberances retain the leads in the grooves. The component also is located in spaced relationship to the inner wall of the shell by being engaged with a projection on the inner wall, or by the bends in its leads being engaged with inner end portions of the grooves. Where a plurality of components are mounted in the shell, each component may be located in a compartment defined in part by one or more intermediate walls projecting from the inner wall of the shell and extending between the opposed side walls of the shell.

DETAILED DESCRIPTION

Figures 1, 2, 3, 4:
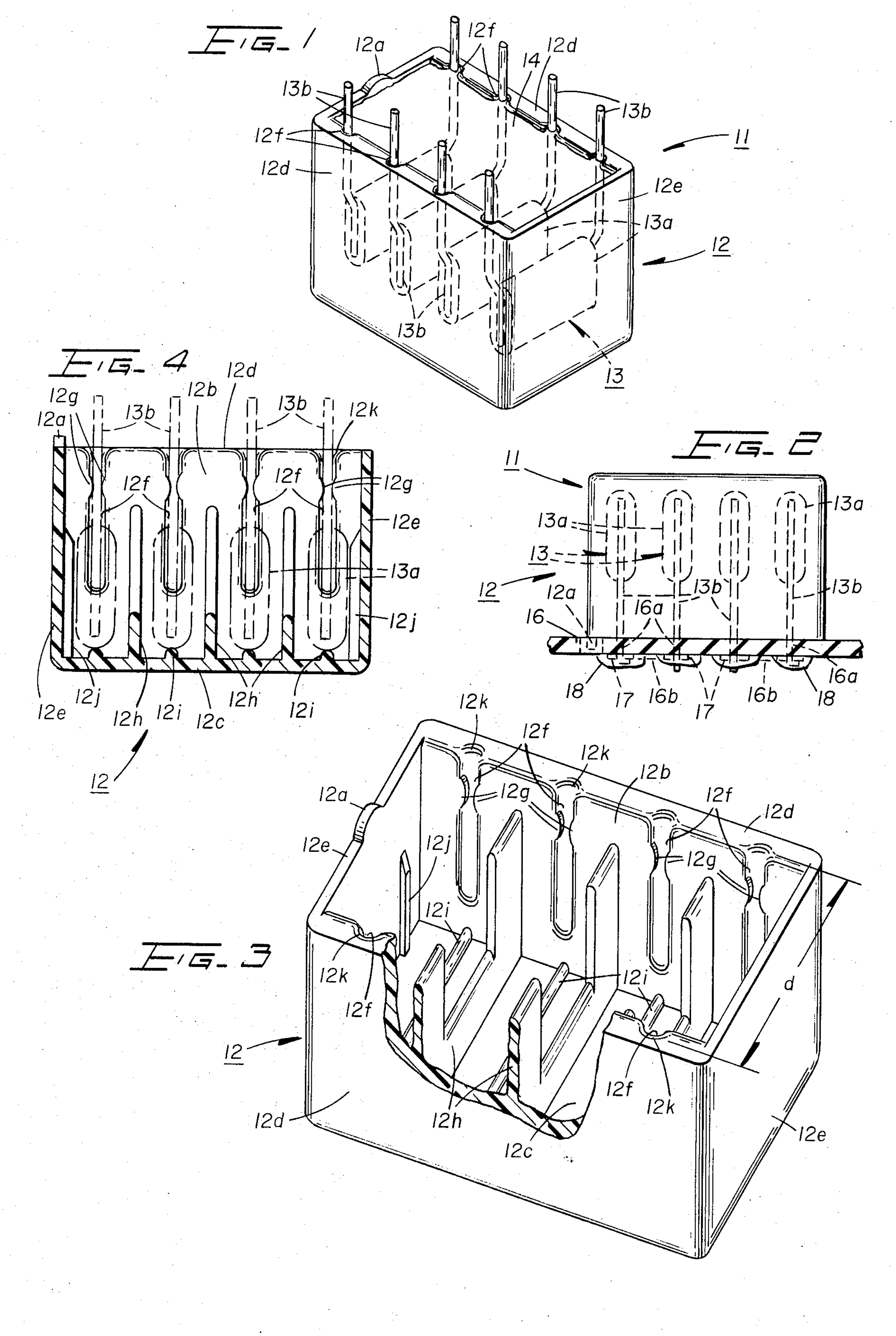
FIG. 1 is an isometric view of a packaged electrical component assembly in accordance with the invention.
FIG. 2 is a side view of the packaged component assembly shown in FIG. 1, mounted on a printed circuit board.
FIG. 3 is an isometric view illustrating a shell member utilized in fabricating the packaged component assembly shown in FIG. 1.
FIG. 4 is a cross-sectional view of the shell member shown in FIG. 3, taken along its centerline.

Referring to FIG. 1, a packaged electrical component assembly 11 in accordance with the invention includes a shell member 12 of molded plastic and a plurality of electrical components, such as capacitors 13. Each capacitor 13 has a body **13*a* which is wound from alternate layers of a metallized polyester film and flattened in a suitable manner. The ends of each capacitor body 13*a* then are spray soldered, the body is impregnated with wax, and a pair of radially projecting leads 13*b*** are fixedly mounted on the opposite ends of the body by soldering. Other electrical devices such as other types of capacitors, resistors, diodes, etc., also are adapted to be packaged by the method of this invention.

The capacitors 13 are electrically insulated from one another and moisture-proofed by being encapsulated in the shell 12 in a suitable potting compound 14, the shell and the potting compound both having a relatively high dielectric strength and imperviousness to moisture. For example, the shell 12 may be a thermoplastic resin, such as an acrylonitrile-butadiene-styrene polymer available under the tradename "Cycolac" from Marbon Chemical, Division of Borg Warner Corporation, Washington, West Virginia. However, where high heat resistance is necessary and the shell 12 is to function as a thermal barrier, a thermosetting alkyd resin, such as that available under the tradename "Glaskyd" from the American Cyanamid Corporation, Perrysburg, Ohio, may be utilized. In either instance, the potting compound 14 may be an epoxy resin available under the tradename "Epi-Rez" (Number 5071) from the Celanese Resins Division, Celanese Corporation, Louisville, Ken. mixed with a suitable hardener.

The capacitors 13 are mounted in the shell 12 in accordance with this invention, in a manner to be described, so that outer portions and free ends of the capacitor leads **13*b* project from the potting compound 14 in exact positions such that the leads can be readily inserted into preformed apertures 16*a* in a printed circuit board 16, and through land areas 17 on the underside of the board, as illustrated in FIG. 2. Selected ones of the leads 13*b*, such as at the corners, then are crimped to the underside of the circuit board 16 to anchor the assembly 11 thereto for a soldering operation, and the leads and the land areas 17 are encapsulated in solder 18 in a conventional manner. Suitable circuit paths 16*b* on the printed circuit board 16 interconnect the capacitors 13 electrically as necessary, the capacitors generally having been chosen by value so that when interconnected in parallel pairs or other multiples, their combined capacitances equal one or more desired capacitance values. Where the packaged assembly 11 is not electrically symmetrical, but is physically symmetrical as shown in FIGS. 1 and 2, the shell 12 preferably is provided with an orienting tab 12*a* at one end, which is receivable in a preformed recess or aperture in the printed circuit board 16** to assist in mounting the packaged assembly on the circuit board with the proper polarity.

As viewed in FIGS. 3 and 4, the molded shell 12 has an open top or mouth **12*b* and an inner bottom wall 12*c* in opposed relationship, opposed side walls 12*d*, and opposed end walls 12*e*. The side walls 12*d* have sets of opposed vertical grooves 12*f* formed therein for receiving the leads 13*b* of respective ones of the capacitors 13 in relatively close-fitting relationship, the upper ends of the grooves being flared outward and opening through upper edges of the side walls. The vertical axes of the grooves 12*f* are accurately located along the side walls 12*d*** and are spaced apart a distance "*d*" (FIG. 3) so as to have positions which correspond to the positions of the preformed apertures **16*a* in the printed circuit board 16 (FIG. 2**). While in the illustrated embodiment of the invention the distance "*d*" is uniform for all of the sets of grooves **12*f***, it is apparent that the distance "*d*" can vary between the sets of the grooves as necessary, where different size capacitors 13 are involved in the same assembly 11.

Figure 7:
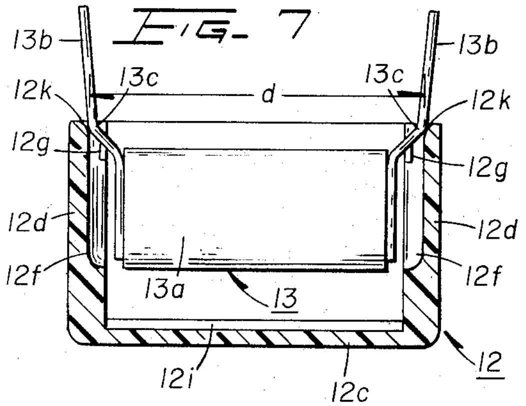
FIG. 7 is a cross-sectional view illustrating an initial stage in the insertion of an electrical component into the shell member shown in FIG. 3.
Figure 8:
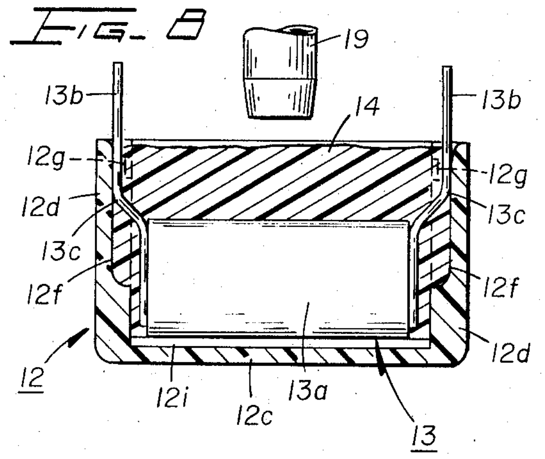
FIG. 8 is a cross-sectional view similar to FIG. 7 illustrating the final stage of the component insertion step and the encapsulation of the component in the shell member.

Adjacent the upper end of each groove **12*f* a pair of opposed lead retaining protuberances 12*g* define a space therebetween which is slightly less (several thousandths of an inch) than the diameter of the capacitor leads 13*b* so that as is apparent from FIGS. 4, 7 and 8, an inner portion of one of the leads can be forced or snapped through the space under slight pressure and downward into the groove, the protuberances having sufficient inherent resiliency for this purpose. The outer portion of lead 13*b* then is retained in the groove 12*f* by the protuberances 12*g*, which, as shown in FIGS. 3, 4, 7 and 8, are spaced inward from outer wall portions of the groove to permit the outer portion of the lead to move longitudinally in the groove during the assembling operation. While the protuberances 12*g* are shown in opposed pairs, it is apparent that other arrangements could be utilized. For example, the protuberances 12*g* could be offset vertically on opposite or the same sides of their respective grooves 12*f*, or only a single protuberance could be provided for each groove, if so desired. During the molding of the shell 12, the protuberances 12*g*** also function to help insure that a mold core member for forming the interior of the shell, will withdraw the shell out of a mold cavity for molding its exterior.

The shell 12 is divided into a plurality of capacitor receiving compartments by spaced intermediate walls or fins **12*h* which are upstanding from the inner bottom wall 12*c* and which extend between the side walls 12*d*. The intermediate walls 12*h*, which enhance the electrical isolation of the individual capacitors 13 from one another, are depressed in their central portions to facilitate the flow of the potting material 14 between the compartments defined thereby during the potting operation. In this regard, while the capacitor bodies 13*a* are shown spaced from the intermediate walls 12*h* in the illustrated embodiment of the invention, the capacitor bodies may be located closely adjacent these walls, if so desired. However, since the material forming the shell 12 generally is less moisture-resistant than the potting material 14, it is preferable that a layer of the potting material 14 exist between each capacitor body 13*a* and the exterior of the shell 12 in the finished assembly 11. Thus, each compartment as defined by the intermediate walls 12*h* includes an elongated rib 12*i* of relatively small height as compared to the intermediate walls, on the bottom wall 12*c* and extending between the side walls 12*d*, to limit the inward movement of the capacitor body 13*a* into the shell 12 and thereby space the capacitor body from the bottom wall. Additional ribs 12*j* also are formed on the end walls 12*e* to insure spacing of the capacitor bodies 13*a* from these surfaces for the same purpose. Further, where the shell 12 is of a relatively brittle material, such as the above-mentioned thermosetting alkyd resin, similar spacer ribs (not shown) may be provided on the intermediate walls 12*h* to insure that layers of the potting material 14 will form between the capacitor bodies 13*a*** and these walls, as reinforcement for the walls.

Figure 5:
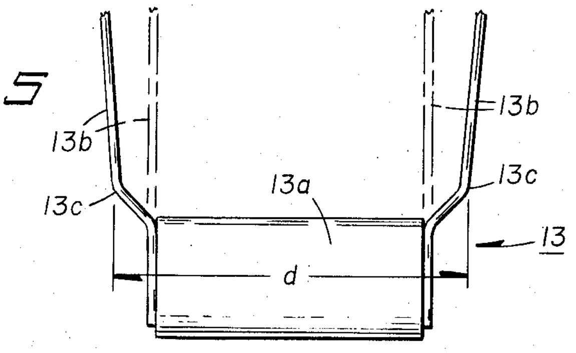
FIG. 5 is an elevational view of an electrical component having radially extending leads, and which may be utilized in fabricating the packaged component assembly shown in FIG. 1.

FIG. 5 illustrates the manner in which the self-supporting leads **13*b* of each capacitor 13, which normally extend radially from the opposite ends of the capacitor body 13*a* as shown in broken lines, are prepared for insertion of the capacitor into the shell 12. First, the leads 13*b* are bent outward in a common plane at points adjacent the body 13*a* of the capacitor 13, and then reverse-bent at points 13*c* spaced from the ends of the capacitor, into positions in which their outer portions extend at an acute angle to the capacitor body, as shown in solid lines. Similarly, referring to FIG. 6, in utilizing a capacitor 13' in which a capacitor body 13*a*' has axially extending self-supporting leads 13*b*', as shown in broken lines, the leads are bent in a common plane into substantially radially extending positions with respect to the capacitor body, but at an acute angle thereto, at points 13*c*' spaced from the ends of the capacitor body, as shown in solid lines. In each instance the bend points 13*c* and 13*c*'** define bends which are spaced apart a distance on the order of, but not greater than, the spacing "*d*" of the grooves **12*f* in the side walls 12*d* of the shell 12. The thus defined bends 13*c* and 13*c*'** may be formed by hand, or by a suitable device forming no part of this invention and therefore not shown.

Figure 6:
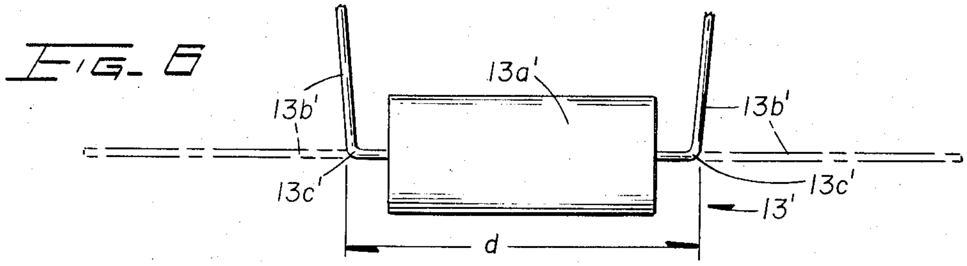
FIG. 6 is an elevational view of an electrical component having axially extending leads and which also may be utilized in fabricating a packaged component assembly as shown in FIG. 1.

FIGS. 7 and 8 illustrate, with respect to the capacitor 13 of FIG. 5, the manner in which the capacitor is inserted into the shell 12. Initially, the capacitor 13 is positioned with outer portions of its leads **13*b* engaged with arcuate camming surfaces 12*k* at the flared open ends of respective ones of the grooves 12*f* in the shell side walls 12*d*. The capacitor body 13*a* then is pushed into the shell 12 and as the leads 13*b* ride along the arcuate camming surfaces 12*k*, the outer portions of the leads are flexed into positions in which they extend radially with respect to the capacitor body 13*a* and parallel to the grooves 12*f*. Sufficient pressure is exerted on the capacitor body 13*a* so that the inner portions of the leads 13*b* adjacent the capacitor body are pushed through the spaces defined by the opposed protuberances 12*g*, after which the protuberances retain the outer portions of the leads in the grooves and preclude overbending of the leads beyond a radially extending position. As is illustrated in FIG. 7, the leads 13*b* support the capacitor body 13*a* during the insertion process. Subsequently, the capacitor 13*a* seats on the adjacent elongated rib 12*i* on the shell inner bottom wall 12*c*. The leads 13*b* of the capacitor 13 now are properly located in the grooves 12*f* and bear against the groove walls so as to extend from the open ends thereof in the desired positions corresponding to the positions of the apertures 16*a* in the printed circuit board 16 (FIG. 2). As is apparent from FIG. 8, the opposite ends of the capacitor body 13*a* also are located in spaced opposed relationship with respect to the side walls 12*d* of the shell 12 by the inner portions of the leads 13*b*. The capacitor 13' of FIG. 6 is inserted into the shell 12 in the same manner as the capacitor 13, with the arcuate camming surfaces 12*k* and the opposed protuberances 12*g*** functioning as above described.

After the capacitors 13 have been inserted into the shell 12, they may be subjected to a final test operation and any defective units replaced. The shell 12 then is filled with the dielectric potting compound 14 in any suitable manner, such as by positioning the shell beneath a compound dispensing nozzle 19 (FIG. 8). During the filling process the flexed leads **13*b* and the bends 13*c* in the leads maintain the ends of each capacitor body 13*a* spaced from the side walls 12*d* of the shell 12, and the ribs 12*i* and 12*j* keep the capacitor bodies 13*a* spaced from the inner bottom wall 12*c* and the end walls 12*e*, to insure that each capacitor body 13*a* is encapsulated in the potting material 14 between the capacitor body and the exterior of the shell 12. After the potting operation, the portions of the leads 13*b* projecting from the mouth 12*b* of the shell 12 can be trimmed to length and straightened, if necessary, and the finished assembly 11 then is ready for mounting on the printed circuit board 16, as shown in FIG. 2**.

Figure 9:
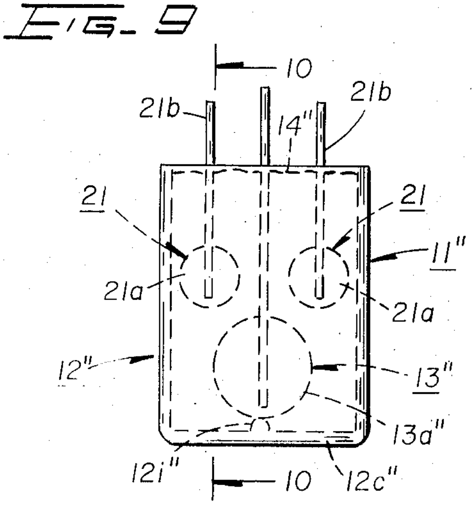
FIG. 9 is a side elevational view of an alternate embodiment of the invention.
Figure 10:
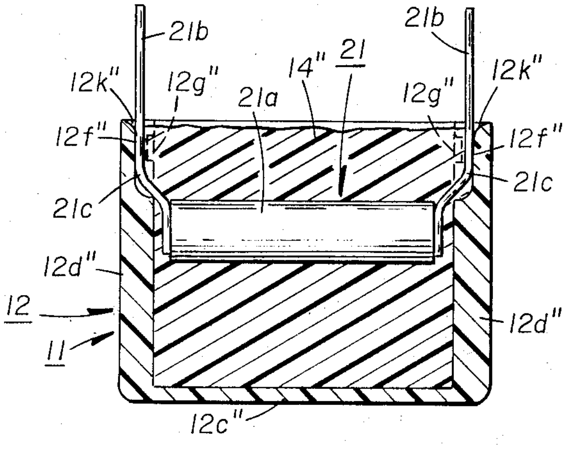
FIG. 10 is a cross-sectional view taken substantially along the line 10—10 of FIG. 9.

In the embodiment of the invention shown in FIG. 9, a packaged component assembly 11'' includes a shell 12'' of plastic material, a capacitor 13'' having a relatively large cylindrical body **13*a*'' located adjacent an inner bottom wall 12*c*'' of the shell, and a pair of relatively small capacitors 21, each having a cylindrical body 21*a* and radially extending leads 21*b*. The capacitor 13'' is inserted into the shell 12'' in the same manner as described hereinabove for the capacitors 13 or 13' in FIGS. 1–8 and the shell 12'' is filled with a substantially fluid-impervious dielectric potting material 14'' so as to encapsulate the capacitors 13'' and 21 therein. However, to reduce the size of the assembly 11'', the pair of small capacitors 21 are located in the shell 12 above and in overlapping relationship with respect to the first capacitor 13'', and therefore it is necessary that the inward movement of the capacitors 21 into the shell be interrupted a substantial distance above the inner bottom wall 12***c* ''. Referring to FIG. 10, this is accomplished by terminating opposed lead receiving grooves 12*f*'' in side walls 12*d*'' of the shell 12'' at the desired distance above the inner bottom wall 12*c*''. Thus, as each capacitor 21 is inserted into the shell, portions of the leads 21*b* adjacent bends 21*c* in the leads of the capacitor will engage the bottoms of the grooves 12*f*'' to interrupt downward movement of the capacitor and locate it in the desired elevated position. In other respects, insertion of each capacitor 21 into the shell 12 is accomplished as described in the embodiment of the invention shown in FIGS. 1–8, with protuberances 12*g*'' and camming surfaces 12*k*'' functioning in the same manner.

Summarizing, a plug-in type packaged component assembly 11, as shown in FIG. 1, and a method of fabricating it, has been provided in which a plurality of electrical components having either axial or radial leads, such as the capacitors 13 or 13', can be readily packaged with portions of the capacitor leads 13*b* or 13*b*' projecting from the same side of the finished package assembly in exact desired positions, whereby the leads can subsequently be inserted directly through preformed apertures 16*a* in a printed circuit board 16, for mounting of the assembly 11 on the circuit board, as shown in FIG. 2. further, the capacitors 13 or 13' are electrically insulated and protected against moisture by the shell 12 and the potting material 14 so that the finished package 11 is relatively stable under operating conditions. The embodiment of the invention shown in Figs. 9 and 10 also provides an assembly 11'' in which components, such as the capacitors 13'' and 21, can be arranged in multiple layers to conserve space and to reduce the size of the finished assembly.

What is claimed is:

1. A packaged electrical component assembly, which comprises:

a shell of substantially fluid-impervious dielectric material having an inner wall and an open mouth in opposed relationship, and having a pair of opposed side walls, the side walls having sets of oppositely disposed parallel grooves located in predetermined positions and having open ends adjacent the open mouth of said shell;

a plurality of electrical components each having a body with self-supporting leads fixedly mounted on and projecting from opposite ends thereof, said components being disposed between the opposed side walls of said shell in spaced relationship to the inner wall of said shell and with the opposite ends of each of said component bodies in opposed spaced relationship to the side walls of said shell, the leads of each component having inner portions which extend outward in an axial direction relative to said body of said component toward the side walls of said shell to space the opposite ends of said component body from the side walls of said shell, and also having outer portions which extend radially of said body of said component in respective ones of the grooves in said shell to forcefully bear against the groove walls with free ends of the leads projecting from the open ends of said grooves in the predetermined positions defined by the grooves; and a mass of substantially fluid-impervious dielectric potting material filling a portion of said shell and encapsulating said component bodies, including the spaced opposite ends of said component bodies and portions of the leads in said shell.

2. A packaged electrical component assembly, as recited in claim 1, which further comprises:

lead retaining protuberances adjacent the grooves in the side walls of said shell, said protuberances defining spaces which are slightly less than the diameters of their respective leads and through which the inner portions of the leads can pass during the assembly of said components into said shell, and said protuberances being spaced inward from outer wall portions of the grooves to permit the outer portions of the leads to move longitudinally in the grooves during the assembly of the components into said shell with said protuberances retaining the outer portions of the leads in the grooves.

3. A packaged electrical component assembly, as recited in claim 1, in combination with a printed circuit board, in which:

the free ends of the leads of said components which project from the open ends of said grooves in said shell are received through apertures in said printed circuit board corresponding to the predetermined positions defined by the open ends of said grooves;

said electrical components are electrically isolated from each other within the electrical component assembly and are electrically interconnected only by circuitry on said printed circuit board; and said shell and said printed circuit board include an orienting tab and a tab-receiving recess for properly orienting the electrical component assembly with respect to the associated interconnecting circuitry on said printed circuit board.

4. A packaged electrical component assembly, as recited in claim 1, in which:

said bodies of at least two of said components are spaced different distances from the inner wall of said shell and have body portions overlapped with respect to one another as viewed in the direction of the grooves in the side walls of said shell;

the sets of grooves in the side walls of said shell in which the self-supporting leads of said two components are received terminate at different distances with respect to the inner wall of said shell; and at least said component which is farthest from the inner wall of said shell has the bends in the self-supporting leads thereof engaged in ends of the grooves in which the leads are received, to space said component from the inner wall of said shell and said other component.

5. A method of encapsulating an electrical component having self-supporting leads fixedly mounted on and projecting from opposite ends of a body of the component so that outer portions of the leads are capable of relative movement, which comprises:

forming an open-mouth, substantially fluid-impervious dielectric shell with parallel grooves in a pair of oppositely disposed side walls, the grooves being spaced apart a predetermined distance to define predetermined positions for the outer portions of the leads of the component and having open ends adjacent the mouth of the shell;

bending the projecting leads of the component in a common plane so that inner portions of the leads extend outward in an axial direction relative to the body of the component and the outer portions of the leads extend outwardly at an acute angle to the body of the component beyond the open ends of the grooves, and so that bends in the leads between their inner and outer portions are spaced outward from the respective ends of the component body and are spaced apart a distance on the order of the predetermined spacing of the grooves in the shell;

moving the component into the mouth of the shell with the opposite ends of the component body in opposed relationship to the side walls of the shell and with the outer portions of the leads riding on surface portions of the grooves adjacent the open ends of the grooves, so as to flex the outer portions of the leads into substantially parallel relationship with the grooves and so that the outer portions of the leads project from the open ends of the grooves in the predetermined positions defined by the grooves, with the inner portions of the leads locating the opposite ends of the component body in spaced relationship to the side walls of the shell; and encapsulating the component in the shell in a substantially fluid-impervious dielectric potting material.

6. A method of encapsulating an electrical component as recited in claim 5, which further comprises:

confining the outer portions of the leads against overflexing and transverse movement out of the grooves in the side walls of said shell as the outer portions of the leads ride in the grooves during the movement of the component into the shell.

7. A method of encapsulating an electrical component, as recited in claim 5, which further comprises:

engaging the bends which have been formed in the leads of at least one of the components to interrupt the inward movement of the component into the shell toward an inner wall of the shell so that the body of the component is spaced from the inner wall of the shell; and filling substantially the entire space between the body of the component and the inner wall of the shell with the potting material.

8. A method of encapsulating an electrical component, as recited in claim 5, which further comprises:

moving at least one of the components into the shell with a body portion of the component in overlapped relationship with respect to a body portion of a second component in the shell as viewed in the direction of the grooves in the shell; and engaging the bends which have been formed in the leads of the first component to interrupt the inward movement of the component toward an inner wall of the shell and to locate the first component in spaced relationship to the inner wall of the shell and the second component.

* * * * *